United States Patent
Kim et al.

(10) Patent No.: US 9,830,973 B2
(45) Date of Patent: Nov. 28, 2017

(54) SEMICONDUCTOR MEMORY DEVICE FOR IMPROVING SIGNAL INTEGRITY ISSUE IN CENTER PAD TYPE OF STACKED CHIP STRUCTURE

(71) Applicant: Samsung Electronics Co., Ltd., Suwon-si (KR)

(72) Inventors: Keung Beum Kim, Hwaseong-si (KR); HyunJong Moon, Seoul (KR); Heeseok Lee, Suwon-si (KR); Seung-Yong Cha, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 15/639,073

(22) Filed: Jun. 30, 2017

(65) Prior Publication Data

US 2017/0301392 A1   Oct. 19, 2017

Related U.S. Application Data

(63) Continuation of application No. 15/207,989, filed on Jul. 12, 2016, now Pat. No. 9,721,644.

(30) Foreign Application Priority Data

Sep. 4, 2015  (KR) ........................ 10-2015-0125715

(51) Int. Cl.
*G11C 5/02* (2006.01)
*G11C 11/4093* (2006.01)
(Continued)

(52) U.S. Cl.
CPC ........ *G11C 11/4093* (2013.01); *G11C 7/1057* (2013.01); *G11C 7/1084* (2013.01);
(Continued)

(58) Field of Classification Search
CPC ... G11C 5/02; G11C 11/4093; G11C 11/4087; G11C 11/4096
(Continued)

(56) References Cited

U.S. PATENT DOCUMENTS

| 6,754,132 B2 | 6/2004 | Kyung |
| 6,937,494 B2 | 8/2005 | Funaba et al. |

(Continued)

FOREIGN PATENT DOCUMENTS

| JP | 2943511 | 8/1999 |
| JP | 2004152131 | 5/2004 |

(Continued)

OTHER PUBLICATIONS

"Semiconductor Memory Device for Improving Signal Integrity Issue in Center Pad Type of Stacked Chip Structure" Specification, Drawings, Claims and Prosecution History, of U.S. Appl. No. 15/207,989, dated Jul. 12, 2016, by Keung Beum Kim, et al., which is stored in the United States Patent and Trademark Office (USPTO) Image File Wrapper (IFW) system.

*Primary Examiner* — Harry W Byrne
(74) *Attorney, Agent, or Firm* — Onello & Mello, LLP

(57) ABSTRACT

A semiconductor memory device includes a first memory die having a first termination resistor for an on-die termination and a second memory die having a second termination resistor for an on-die termination and formed on the first memory die. Each of the first and second memory dies has a center pad type and operates based on a multi-rank structure. When the first memory die is accessed, the second termination resistor is connected to the second memory die, and when the second memory die is accessed, the first termination resistor is connected to the first memory die.

20 Claims, 9 Drawing Sheets

(51) Int. Cl.
 *H01L 27/108* (2006.01)
 *H01L 25/065* (2006.01)
 *G11C 11/408* (2006.01)
 *G11C 11/4096* (2006.01)
 *G11C 7/10* (2006.01)

(52) U.S. Cl.
 CPC ...... *G11C 11/4087* (2013.01); *G11C 11/4096* (2013.01); *H01L 25/0657* (2013.01); *H01L 27/10897* (2013.01); *H01L 2224/16145* (2013.01); *H01L 2224/16225* (2013.01); *H01L 2225/06513* (2013.01); *H01L 2225/06544* (2013.01); *H01L 2924/15192* (2013.01); *H01L 2924/15311* (2013.01)

(58) Field of Classification Search
 USPC .......................................................... 365/51
 See application file for complete search history.

(56) References Cited

U.S. PATENT DOCUMENTS

| | | | |
|---|---|---|---|
| 7,123,047 B2 | 10/2006 | Lim | |
| 7,180,327 B2 | 2/2007 | So et al. | |
| 7,247,921 B2 | 7/2007 | Sugiura et al. | |
| 7,486,104 B2 | 2/2009 | Oh et al. | |
| 7,554,353 B2 | 6/2009 | Lee et al. | |
| 7,700,944 B2 | 4/2010 | Nishizawa | |
| 7,755,169 B2 | 7/2010 | Watanabe et al. | |
| 7,888,776 B2 | 2/2011 | Ogawa et al. | |
| 8,076,954 B2 | 12/2011 | Murayama et al. | |
| 8,588,012 B2 | 11/2013 | Wilson et al. | |
| 8,890,560 B2 | 11/2014 | Kaltalioglu | |
| 8,966,208 B2 * | 2/2015 | Gillingham | G06F 1/3203 711/105 |
| 9,196,321 B2 | 11/2015 | Huber et al. | |
| 2007/0247185 A1 | 10/2007 | Oie et al. | |
| 2011/0180922 A1 | 7/2011 | Chen et al. | |
| 2011/0208906 A1 * | 8/2011 | Gillingham | G06F 1/3203 711/105 |
| 2015/0161072 A1 * | 6/2015 | Gillingham | G06F 1/3203 711/167 |

FOREIGN PATENT DOCUMENTS

| | | |
|---|---|---|
| JP | 2008022574 | 1/2008 |
| JP | 2010281625 | 12/2010 |
| KR | 20050095387 | 9/2005 |

\* cited by examiner

SEMICONDUCTOR MEMORY DEVICE FOR IMPROVING SIGNAL INTEGRITY ISSUE IN CENTER PAD TYPE OF STACKED CHIP STRUCTURE

CROSS-REFERENCE TO RELATED APPLICATIONS

This application is a continuation of U.S. patent application Ser. No. 15/207,989, filed Jul. 12, 2016, which claims priority under 35 U.S.C. §119 to Korean Patent Application No. 10-2015-0125715 filed Sep. 4, 2015, in the Korean Intellectual Property Office, the contents of which are herein incorporated by reference in their entirety.

BACKGROUND

Some examples of the present inventive concepts relate to a semiconductor memory device, and, more particularly, relate to a semiconductor memory device of a stacked chip structure in which a plurality of memory dies are stacked.

A dynamic random access memory DRAM may be implemented in the form of a multi-chip package to increase memory capacity. That is, the multi-chip package denotes a package in which a plurality of memory dies are stacked. For example, the plurality of memory dies may have a substrate interposed therebetween and may receive signals provided from a controller. This structure may be called, for example, a dual-rank structure.

As a transmission speed increases, a swing width of a signal exchanged between the controller and the DRAM gradually decreases to minimize a delay time taken to transmit the signal. As the swing width decreases, the influence of an external noise on the signal increases, and reflection of the signal according to impedance mismatching at an interface terminal becomes critical. When the impedance mismatching occurs during transmission of the signal, a signal integrity issue arises. A decrease in the signal integrity makes it difficult to rapidly transmit the signal and causes an error during an access operation including a write operation and a read operation of the DRAM.

Accordingly, in a DRAM die of a receiving side, an impedance matching circuit referred to as "on-die termination" or "on-chip termination" is mounted near a pad in a memory die. Generally, in an on-die termination scheme, a source termination is made in a device, for example, a controller, of a transmitting side. In a memory, for example, memory die, of a receiving side, a parallel termination is made by a termination circuit connected in parallel, with respect to a reception circuit connected to an input pad.

SUMMARY

Example embodiments of the present inventive concepts provide a semiconductor memory device and a semiconductor system capable of resolving a signal integrity issue according to a stub effect of a redistribution layer connected to a center pad in a stacked chip structure having a center pad type and operating in a multi-rank structure.

According to an aspect of the present inventive concepts, a semiconductor memory device may include a first memory die having a first termination resistor configured for an on-die termination, and a second memory die having a second termination resistor configured for an on-die termination and formed on the first memory die. Each of the first and second memory dies may have a center pad type and may operate based on a multi-rank structure. The second termination resistor may be connected to the second memory die when the first memory die is accessed. The first termination resistor may be connected to the first memory die when the second memory die is accessed.

In some example embodiments, a center pad of each of the first and second memory dies may be wire-bonded at a die edge through a redistribution layer.

In some example embodiments, a stub length of the redistribution layer may be greater than or equal to 1000 μm.

In some example embodiments, the first termination resistor may be further connected to the first memory die when the first memory die is accessed.

In some example embodiments, the second termination resistor may be further connected to the second memory die when the second memory die is accessed.

In some example embodiments, each of the first and second memory dies may be a mobile dynamic random access memory (DRAM).

In some example embodiments, a connection operation of the first termination resistor may be performed in response to a first on-die control signal provided from a controller.

In some example embodiments, a connection operation of the second termination resistor may be performed in response to a second on-die control signal provided from a controller.

In some example embodiments, the first memory die may be stacked on the controller and may be controlled by the controller.

In some example embodiments, the first memory die may be disposed at a same layer as the controller.

According to another aspect of the present inventive concepts, a semiconductor memory device may include a first memory die having a first termination resistor configured for an on-die termination and a second memory die having a second termination resistor configured for the on-die termination and formed on the first memory die. Each of the first and second memory dies may have a center pad type and operates based on a multi-rank structure. When the first memory die is accessed, the first termination resistor and the second termination resistor may be respectively connected to the first memory die and the second memory die. When the second memory die is accessed, the second termination resistor and the first termination resistor may be respectively connected to the second memory die and the first memory die.

In some embodiments, a center pad of each of the first and second memory dies is commonly wire-bonded at a die edge through a redistribution layer.

In some embodiments, a stub length of the redistribution layer is greater than or equal to 800 μm.

In some embodiments, the second termination resistor is further connected to the second memory die when the second memory die is accessed.

In some embodiments, the first memory die is disposed at a same layer as a controller in a same package and receives an address and a command from the controller.

According to another aspect of the present inventive concepts, a semiconductor system may include a control unit comprising an on-die termination control unit, and a semiconductor memory device including a first memory die connected to the control unit and having a first termination resistor and a second memory die connected to the control unit. The second memory die has a second termination resistor and is formed on first memory die. Each of the first and second memory dies in the semiconductor memory device may have a center pad type and may operate based on a multi-rank structure. When the first memory die is accessed, the second termination resistor may be connected to the second memory die to increase signal integrity, which is according to a stub effect, of signals used to access to the first memory die. When the second memory die is accessed, the first termination resistor may be connected to the first memory die to increase the signal integrity of signals used to access to the second memory die.

In some embodiments, wherein each of the first and second memory dies is a low power double date rate (DDR) DRAM.

In some embodiments, a connection operation of the first termination resistor is performed in response to a first on-die control signal provided from a controller.

In some embodiments, a connection operation of the second termination resistor is performed in response to a second on-die control signal provided from the controller.

In some embodiments, in the first memory die is stacked on the controller and receives an address, a command, and data from the controller.

According to another aspect of the present inventive concepts, a semiconductor memory device may include a first memory die having a first termination resistor configured for an on-die termination, and a second memory die having a second termination resistor configured for an on-die termination and stacked on the first memory die. When each of the first and second memory dies operates based on a multi-rank structure and a stub length of a redistribution layer exceeds a stub effect permitted length, the second termination resistor may be selected during an operation of the first memory die, and the first termination resistor may be selected during an operation of the second memory die.

In some embodiments, wherein the stub effect permitted length is greater than or equal to 1000 µm.

In some embodiments, pads of each of the first and second memory dies are arranged to have a center pad type.

In some embodiments, the redistribution layer is a metal wire pattern electrically connected between a pad arranged at a center of a die and a metal pattern arranged at an edge of the die.

In some embodiments, a resistor value of the first termination resistor is equal to a resistor value of the second termination resistor.

According to another aspect of the present inventive concepts, a semiconductor memory device includes a first memory die having a first termination resistor, and a second memory die having a second termination resistor. Each of the first and second memory dies has a center pad type. The second termination resistor is selected during an operation of the first memory die, and the first termination resistor is selected during an operation of the second memory die.

In some embodiments, each of the first and second memory dies in the semiconductor memory device operates based on a multi-rank structure.

In some embodiments, a center pad of each of the first and second memory dies is wire-bonded at a die edge through a redistribution layer.

In some embodiments, a stub length of the redistribution layer is greater than or equal to 1000 µm.

In some embodiments, each of the first and second memory dies is a mobile dynamic random access memory (DRAM).

BRIEF DESCRIPTION OF THE FIGURES

The foregoing and other features and advantages of the inventive concepts will be apparent from the more particular description of preferred embodiments of the inventive concepts, as illustrated in the accompanying drawings in which like reference characters refer to the same parts throughout the different views. The drawings are not necessarily to scale, emphasis instead being placed upon illustrating the principles of the inventive concepts.

DETAILED DESCRIPTION

Figure 1:
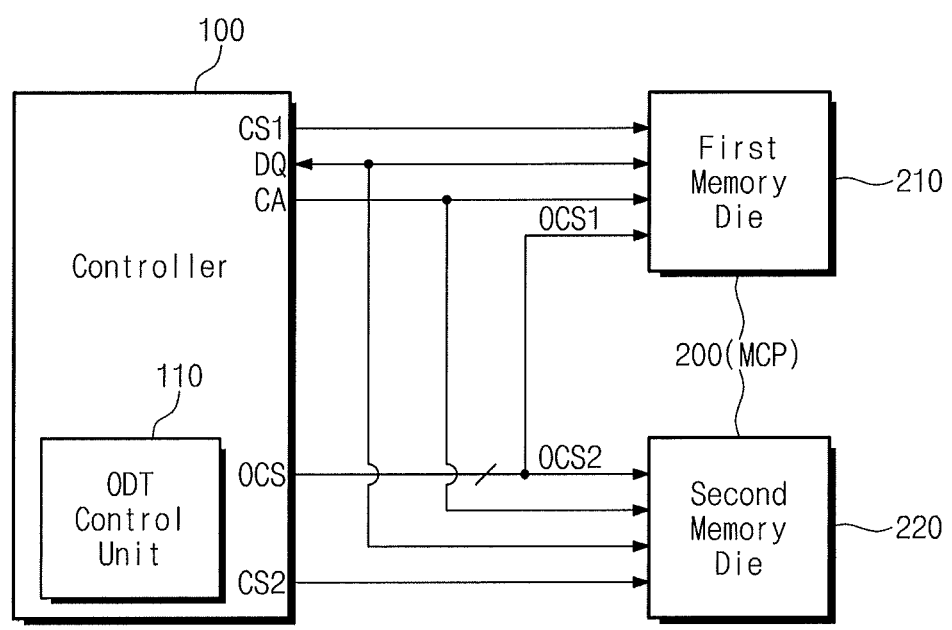
FIG. 1 is a block diagram illustrating a semiconductor system according to some example embodiments of the present inventive concepts.

Various example embodiments will be described more fully hereinafter with reference to the accompanying drawings, in which some example embodiments are shown. The present inventive concepts may, however, be embodied in many different forms and should not be construed as limited to the example embodiments set forth herein.

It will be understood that when an element or layer is referred to as being "on," "connected to" or "coupled to" another element or layer, it can be directly on, connected or coupled to the other element or layer or intervening elements or layers may be present. In contrast, when an element or layer is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present inventive concepts.

Spatially relative terms, such as "beneath," "below," "lower," "above," "upper" and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present inventive concepts. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concepts.

Although corresponding plan views and/or perspective views of some cross-sectional view(s) may not be shown, the cross-sectional view(s) of device structures illustrated herein provide support for a plurality of device structures that extend along two different directions as would be illustrated in a plan view, and/or in three different directions as would be illustrated in a perspective view. The two different directions may or may not be orthogonal to each other. The three different directions may include a third direction that may be orthogonal to the two different directions. The plurality of device structures may be integrated in a same electronic device. For example, when a device structure (e.g., a memory cell structure or a transistor structure) is illustrated in a cross-sectional view, an electronic device may include a plurality of the device structures (e.g., memory cell structures or transistor structures), as would be illustrated by a plan view of the electronic device. The plurality of device structures may be arranged in an array and/or in a two-dimensional pattern.

FIG. 1 is a block diagram illustrating a semiconductor system according to some example embodiments of the present inventive concepts.

Referring to FIG. 1, a semiconductor system may include a semiconductor memory device 200 implemented with a multi-chip package (MCP) structure and a controller 100 for controlling the memory device 200.

The controller 100 may include an on-die termination (ODT) control unit 110 configured, or otherwise contrasted and arranged, to control an on-die termination.

The semiconductor memory device 200 may include at least two memory dies, for example a first memory die 210 and a second memory die 220. When the first memory die 210 is disposed on a substrate, a second memory die 220 may be stacked on the first memory die 210. Alternatively, when the second memory die 220 is disposed on a substrate, the first memory die 210 may be stacked on the second memory die 220.

The first memory die 210 may be activated in response to a first chip selection signal CS1 from the controller 100. The first memory die 210 may receive a command and address CA as a control signal from the controller 100. The first memory die 210 may receive data DQ during a write operation from the controller 100 or may transmit data DQ during a read operation to the controller 100. The first memory die 210 may perform an on-die termination of the first memory die 210 in response to a first on-die control signal OCS1 from the ODT control unit 110 in the controller 100.

The second memory die 220 may be activated in response to a second chip selection signal CS2 from the controller 100. The second memory die 220 may receive a command and address CA as a control signal from the controller 100. The second memory die 220 may receive data DQ during a write operation from the controller 100 or may transmit data DQ during a read operation to the controller 100. The second memory die 220 may perform an on-die termination of the second memory die 220 in response to a second on-die control signal OCS2 from the ODT control unit 110 in the controller 100.

Some example embodiments of the present inventive concepts are illustrated in FIG. 1 such that the controller 100 transmits a command signal, an address signal, and data to both the first and second memory dies 210 and 220. However, the scope and spirit of the present inventive concepts may not be limited thereto.

When the semiconductor system of FIG. 1 is applied to a mobile electronic device, the controller 100 may be a mobile application processor (AP) which is driven by an operating system (OS) such as Android™, iOS™, Windows™, Bada™, Blackberry™, Symbian™, or the like. Moreover, the semiconductor memory device 200 may be, for example, a low power double data rate (LPDDR) type of a dynamic random access memory (DRAM).

Each of the first and second memory dies 210 and 220 may include a semiconductor memory cell array having a plurality of pages for storing data. In this example embodiment, a page may mean a word line, and opening of one page may indicate that all memory cells connected to one word line are accessed. For example, when the number of memory cells connected to one word line is 1024, opening of one page size may mean accessing 1024 memory cells connected to a word line selected by a row address.

The memory cell array of the first and second memory die 210 and 220 may include a main array region in which normal memory cells for storing data are disposed, a dummy array region in which normal memory cells are disposed to guarantee a normal operation, and a redundancy region in which spare memory cells are disposed to repair faults of normal memory cells.

One of the normal memory cells and one of the spare memory cells may have, for example, the same size and form. One DRAM memory cell may include, for example, one access transistor and one storage capacitor.

According to some example embodiments of the present inventive concepts, an access operation may denote an operation to turn on the access transistor at a memory cell in order to read data from the memory cell or to write data to the memory cell.

According to some example embodiments of the present inventive concepts, an active operation, or an active mode of operation, may mean an operation to activate a page, for example, a word line, of a memory cell array selected by a row address.

Pages, for example, word lines, of the memory cell array may be selected by the row decoder, and bit lines thereof may be selected by a column decoder.

The row decoder may decode a row address and may activate a page, for example, or a word line, selected by the decoded row address. The column decoder may decode a column address and may select a bit line using the decoded column address.

A sense amplifier and write driver may amplify data read from a memory cell and may provide the data to an I/O circuit. The sense amplifier and write driver may drive write data which is received from the controller 100 and may provide the write data to the memory cell which is selected. The I/O circuit may output read data from the memory cell which is selected to the controller 100. The I/O circuit may receive write data from the controller 100 and may provide the write data to the sense amplifier and write driver.

Some example embodiments of the present inventive concepts are illustrated in FIG. 1 such that a memory cell array is implemented with DRAM cells. However, the scope and spirit of the present inventive concepts may not be limited thereto. For example, the memory cell array may be implemented with magnetic RAM (MRAM) cells rather than the DRAM cells.

A volatile semiconductor memory device such as a static random access memory (SRAM) or a DRAM may lose data stored therein when a power supply is interrupted. Alternatively, a nonvolatile semiconductor memory device such as a magnetic RAM (MRAM) may retain data stored therein after a power supply is interrupted. Accordingly, the nonvolatile semiconductor memory device may be used to prevent data from being lost due to power failure or power interruption. Particularly, when a memory die (for example, one of the first memory die 210 and the second memory die 220) is a spin transfer torque magneto resistive random access memory (STT-MRAM), the memory die may have an advantage of a MRAM in addition to an advantage of a DRAM. The STT-MRAM cell may include a magnetic tunnel junction (MTJ) element and a selection transistor. The MTJ element may fundamentally include a fixed layer, a free layer, and a tunnel layer formed therebetween. A magnetization direction of the fixed layer may be fixed, a magnetization direction of the free layer may be the same as or opposite to the magnetization direction of the fixed layer under a condition.

Figure 2:
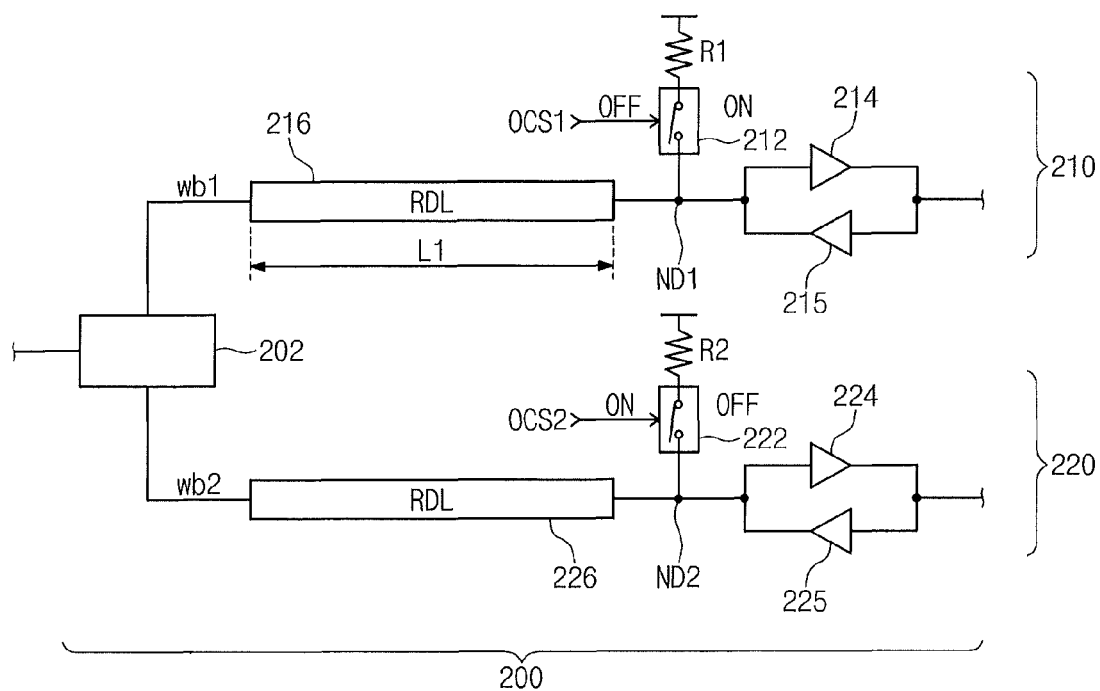
FIG. 2 is a schematic diagram illustrating a termination of memory dies in a semiconductor memory device according to some example embodiments of the present inventive concepts.

FIG. 2 is a schematic diagram illustrating a termination of memory dies in a semiconductor memory device according to some example embodiments of the present inventive concepts.

Referring to FIG. 2, the first memory die 210 may have a first termination resistor R1 for an on-die termination. The first termination resistor R1 may be selectively connected to a first node ND1 based on a switching operation of a first termination connection switch 212. That is, the first termination resistor R1 is selectively connected to the first node ND1 based on a first on-die control signal OCS1. The first node ND1 may be connected to a position of an input pad for receiving a signal. A first metal wire pattern 216 implemented with, for example, a redistribution layer RDL may be formed between the first node ND1 and one end of a wire bonding wb1. Accordingly, a receiving buffer 214 and a transmission buffer 215 of the first memory die 210 may be connected to the first node ND1 and may be placed at a center area of the first memory die 210 to transmit and receive a signal. A common metal pattern 202 may be disposed at the other end of the wire bonding wb1. That is, the common metal pattern 202 and the first metal wire pattern 216 may be connected using the wire bonding wb1. In this embodiment, for an easy wire-bonding of the first memory die 210, the first metal wire pattern 216 may be a wire extending from a pad disposed at a center of a die to an edge of the die.

The first termination resistor R1 may be connected to the first termination connection switch 212. That is, the first termination connection switch 212 may be connected between the first termination resistor R1 and the first node ND1 such that the first termination resistor R1 is selectively connected to the first node ND1 based on the first on-die control signal OCS1. The first termination resistor R1 may be in parallel with the first metal wire pattern 216.

The second memory die 220 may have a second termination resistor R2 for the on-die termination. The second termination resistor R2 may be selectively connected to a second node ND2 based on a switching operation of a second termination connection switch 222. That is, the second termination resistor R2 is selectively connected to the second node ND2 based on a second on-die control signal OCS2. The second node ND2 may be connected to a position of an input pad for receiving a signal. A second metal wire pattern 226 implemented with, for example, a redistribution layer RDL may be formed between the second node ND2 and one end of a wire bonding wb2. Accordingly, a receiving buffer 224 and a transmission buffer 225 of the second memory die 220 may be connected to the second node ND2 and may be placed at a center area of the second memory die 220 to transmit and receive a signal. The common metal pattern 202 may be disposed at the other end of the wire bonding wb2. That is, the common metal pattern 202 and the second metal wire pattern 226 may be connected using the wire bonding wb2. In this embodiment, the second metal wire pattern 226 may be a wire extending from a pad disposed at a die center to an edge of a die for an easy wire-bonding of the second memory die 220.

The second termination resistor R2 may be connected to the second termination connection switch 222. That is, the second termination connection switch 222 may be connected between the second termination resistor R2 and the second node ND2 such that the second termination resistor R2 is selectively connected to the second node ND1 based on the second on-die control signal OCS2. The second termination resistor R2 may be in parallel with the second metal wire pattern 226.

As illustrated in FIG. 2, in a structure in which the first memory die 210 and the second memory die 220 are stacked, in a dual-rank system in which two dies, for example the first and second memory dies 210 and 220, are connected to one signal connection point, one signal line connected to the common metal pattern 202 may have a dual loading to perform an operation based on a dual-rank structure. For example, when a signal applied to one signal line is a command, the command may be transmitted to the common metal pattern 202 and may be transmitted to the first metal wire pattern 216 connected using the wire bonding wb1 and the second metal wire pattern 226 connected using the wire bonding wb2. Accordingly, the command may be simultaneously transmitted to the receiving buffer 214 of the first memory die 210 and the receiving buffer 224 of the second memory die 220.

When each of the first and second memory dies 210 and 220 has a center pad type of pad and operates based on a multi-rank structure, a termination of each of the first and second memory dies 210 and 220 may be an 'other termination' type to minimize or prevent issues with the signal integrity. That is, when the first memory die 210 is accessed, the second termination resistor R2 may be connected to the second node ND2 of the second memory die 220, and, when the second memory die 220 is accessed, the first termination resistor R1 may be connected to the first node ND1 of the first memory die 210.

For example, during a write operation to the first memory die 210, the controller 100 may transmit the first on-die control signal OCS1 for turning off the first termination connection switch 212 to the first termination connection switch 212 and may transmit the second on-die control signal OCS2 for turning on the second termination connection switch 222 to the second termination connection switch 222. That is, the first on-die control signal OCS1 for turning off the first termination connection switch 212 may disconnect the first termination resistor R1 from the first node ND1 and the second on-die control signal OCS2 for turning on the second termination connection switch 222 may connect the second termination resistor to the second node ND2. As a result, a stub effect occurring when a stub length of a redistribution layer exceeds a stub effect permitted length may be reduced. Accordingly, in a stacked chip structure having a center pad type of pad and operating based on a multi-rank structure, an issue with the signal integrity according to a stub effect of a redistribution layer connected to a center pad may be minimized or resolved.

During a write operation to the second memory die 220, the controller 100 may transmit the first on-die control signal OCS1 for turning on the first termination connection switch 212 to the first termination connection switch 212 and may transmit the second on-die control signal OCS2 for turning off the second termination connection switch 222 to the second termination connection switch 222. That is, the first on-die control signal OCS1 for turning on the first termination connection switch 212 may connect the first termination resistor R1 to the first node ND1 and the second on-die control signal OCS2 for turning off the second termination connection switch 222 may disconnect the second termination resistor from the second node ND2. As a result, a stub effect occurring when a stub length of a redistribution layer exceeds a stub effect permitted length may be reduced.

As such, according to some example embodiments of the present inventive concepts, when an access operation is performed with respect to one memory die, the 'other termination', that is, an on-die termination of the other memory die may be made. That is, the second termination resistor R2 is selected during an operation of the first memory die 210, and the first termination resistor R1 is selected during an operation of the second memory die 220. The 'other termination' may be referred to as "non-target on-die termination" in a multi-rank structure having a center-pad type of pad.

As a result, in a double loading structure illustrated in FIG. 2, when a stub length L1 of the redistribution layer 216 is greater than or equal to about 1000 μm, the signal integrity (SI) may be degraded due to a stub effect. Because the stub length L1 is relatively short in a double loading structure of a general edge pad type of mobile DRAM, a stub effect according to the stub length L1 may be small. Accordingly, the signal integrity may not be degraded significantly. However, because the stub length L1 is relatively long in a mobile DRAM of a center-pad-type double loading structure to which a redistribution layer (RDL) is applied, the signal integrity may be degraded significantly. According to some example embodiments of the present inventive concepts, in a multi-rank structure of a center pad type memory, a non-target on-die termination (ODT) schema may be used to improve the signal integrity according to a stub effect.

In some example embodiments, a 'both termination' or an 'all termination' for performing an on-die termination with respect to both memory die in which an access operation is performed and the other memory die in which an access operation is not performed may be made. That is, in FIG. 2, each of the first and second memory dies 210 and 220 may have a center pad type and may operate based on a multi-rank structure. When the first memory die 210 is accessed, the first termination resistor R1 may be connected to the first memory die 210, and the second termination resistor R2 may be connected to the second memory die 220. When the second memory die 220 is accessed, the second termination resistor R2 may be connected to the second memory die 220, and the first termination resistor R1 may be connected to the first memory die 210.

The ODT control unit 110 may transmit a signal to the first memory die 210 and/or the second memory die 220 to monitor the signal integrity. The first memory die 210 and/or the second memory die 220 may transmit a monitor signal for monitoring the signal integrity to the controller 100. The ODT control unit 110 may receive the monitor signal. The 'other termination' may be made when the result of monitoring the signal integrity indicates that the 'other termination' is more effective than the 'both termination'. The 'both termination' may be made when the 'both termination' is more effective than the 'other termination'.

Figure 3:
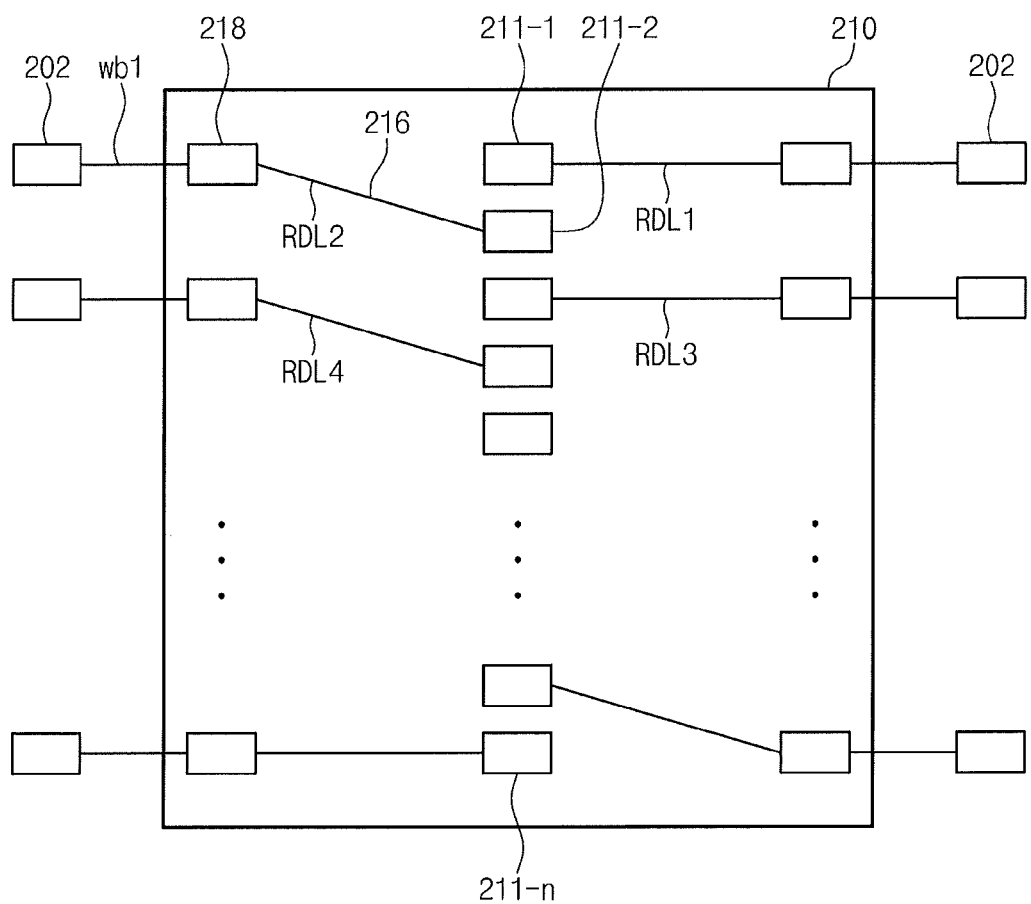
FIG. 3 is a schematic diagram illustrating an arrangement of a center pad type of pad and a metal wire pattern, according to some example embodiments of the present inventive concepts.

A planer arrangement of the semiconductor memory device 200 illustrated in FIG. 2 may be illustrated in FIG. 3.

FIG. 3 is a schematic diagram illustrating an arrangement of a center-pad-type pad and a metal wire pattern, according to some example embodiments of the present inventive concepts.

Referring to FIG. 3, pads 211-1, 211-2 . . . 211-n of the first memory die 210 of the semiconductor memory device 200, which is a center pad type, may be disposed at a center area of the first memory die 210. The RDL2 216 in FIG. 3 may correspond to the first metal wire pattern 216 of FIG. 2. The pad 211-2 illustrated in FIG. 3 may be connected to the first node ND1 illustrated in FIG. 2. The RDL2 216 in FIG. 3 may be connected to an edge metal pattern 218. The edge metal pattern 218 may be connected to the common metal pattern 202 through the wire bonding wb1. As a result, the common metal pattern 202 of FIG. 3 may correspond to the common metal pattern 202 of FIG. 2 placed outside the first memory die 210. Even though not illustrated in FIG. 3, the common metal pattern 202 may be connected to the second metal wire pattern 226 through the wire bonding wb2, as illustrated in FIG. 2.

When the semiconductor memory device 200 has two memory dies, the common metal pattern 202 may have, for example, a double loading structure. However, when the semiconductor memory device 200 has three memory dies, the common metal pattern 202 may have, for example, a triple loading structure.

As such, when the semiconductor memory device operates based on a multi-rank structure and is a center pad type, a stub effect according to a stub length may occur. According to an on-die termination of the present inventive concepts, since the stub effect is minimized or prevented, the signal integrity may be improved.

Figure 4:
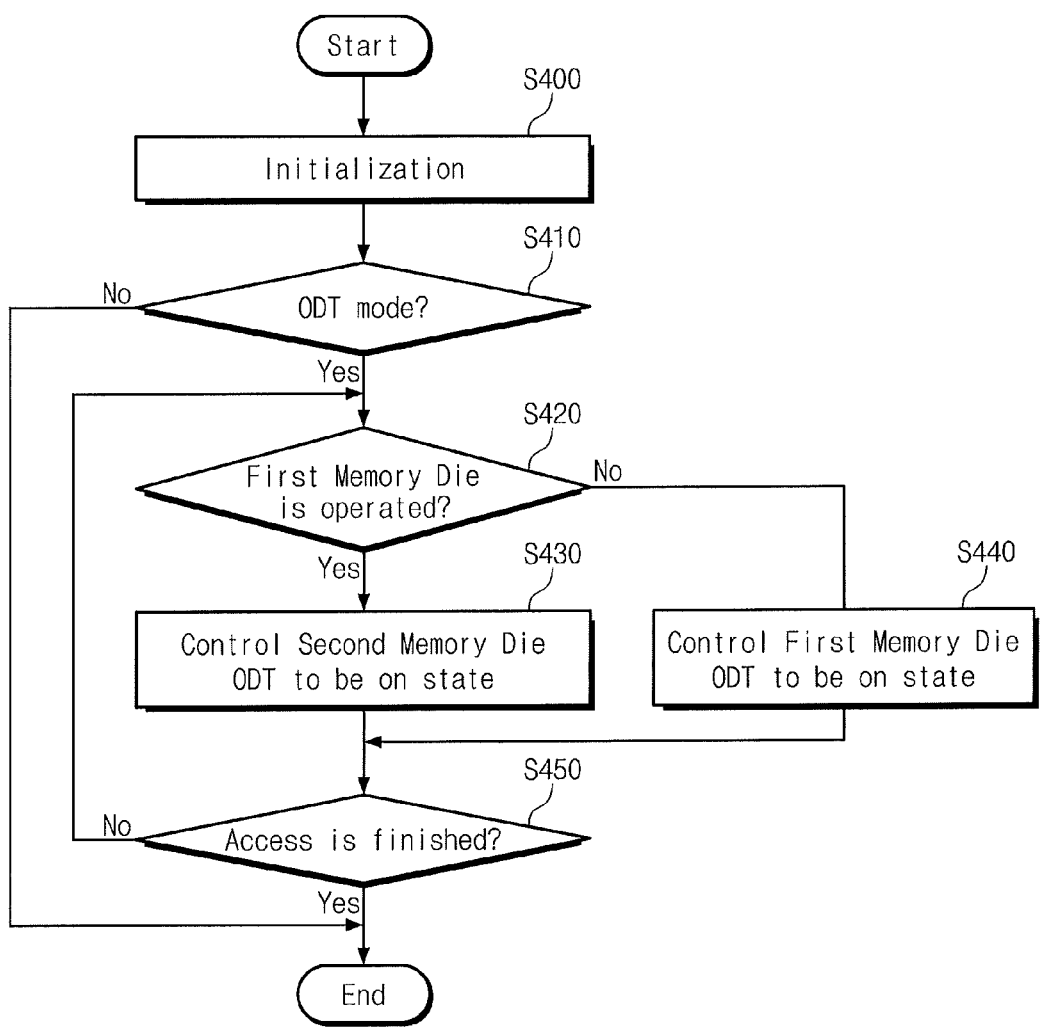
FIG. 4 is a flowchart illustrating a control operation of an on-die termination, according to some example embodiments of the present inventive concepts.

FIG. 4 is a flowchart illustrating an on-die termination according to some example embodiments of the present inventive concepts.

Referring to FIG. 4, at step S400, the ODT control unit 110 in the controller 100 may perform an initialization. The initialization may be periodically performed when a semiconductor system is, for example, powered-on or operated.

At step S410, the ODT control unit 110 may determine whether a current operating mode is an ODT mode. If the operating mode is the ODT mode, the procedure may proceed to step S420. In this embodiment, the ODT mode may be an operating mode to be selected by a user or a program. For example, when an 'other on-die termination' is made such that the signal integrity (SI) is not degraded, an ODT mode may be set to on-state.

At step S420, whether the first memory die 210 is to be operated may be determined. In this embodiment, an operation of the first memory die 210 may include an operation to write data from the controller 100 to a memory cell or to transfer data, which is read from the memory cell, to the controller 100.

When the first memory die 210 is determined to be operated, at step S430, an on-die termination of the second memory die 220 may be set to an on-state. That is, in this embodiment, the controller 100 may transmit the first on-die control signal OCS1 for turning off the first termination connection switch 212 to the first termination connection switch 212 and may transmit the second on-die control signal OCS2 for turning on the second termination connection switch 222 to the second termination connection switch 222. That is, the first on-die control signal OCS1 for turning off the first termination connection switch 212 may disconnect the first termination resistor R1 from the first node ND1 and the second on-die control signal OCS2 for turning on the second termination connection switch 222 may connect the second termination resistor to the second node ND2. The second termination resistor R2 is selected during an operation of the first memory die 210. Accordingly, as with the center pad type, a stub effect occurring when a stub length of a redistribution layer is relatively long may be reduced.

When the first memory die 210 does not operate (i.e., when the second memory die 220 operates), at step S440, an on-die termination of the first memory die 210 may be set to an on-state. In this case, the controller 100 may transmit the first on-die control signal OCS1 for turning on the first termination connection switch 212 to the first termination connection switch 212 and may transmit the second on-die control signal OCS2 for turning off the second termination connection switch 222 to the second termination connection switch 222. That is, the first on-die control signal OCS1 for turning on the first termination connection switch 212 may connect the first termination resistor R1 to the first node ND1 and the second on-die control signal OCS2 for turning off the second termination connection switch 222 may disconnect the second termination resistor from the second node ND2. The first termination resistor R1 is selected during an operation of the second memory die 220. Accordingly, as with the center pad type, the stub effect occurring when a stub length of a redistribution layer is relatively long may be reduced.

At step S450, whether an access operation of the first memory die 210 or the second memory die 220 is finished may be determined. When the access operation is not finished, the procedure may proceed to step S420. When the access operation is finished, an on-die termination may be completed.

Some example embodiments of the present inventive concepts are illustrated such that the 'other termination' is made in two dies based on the flowchart illustrated in FIG. 4. However, the scope and spirit of the present inventive concepts may not be limited thereto.

Figure 5:
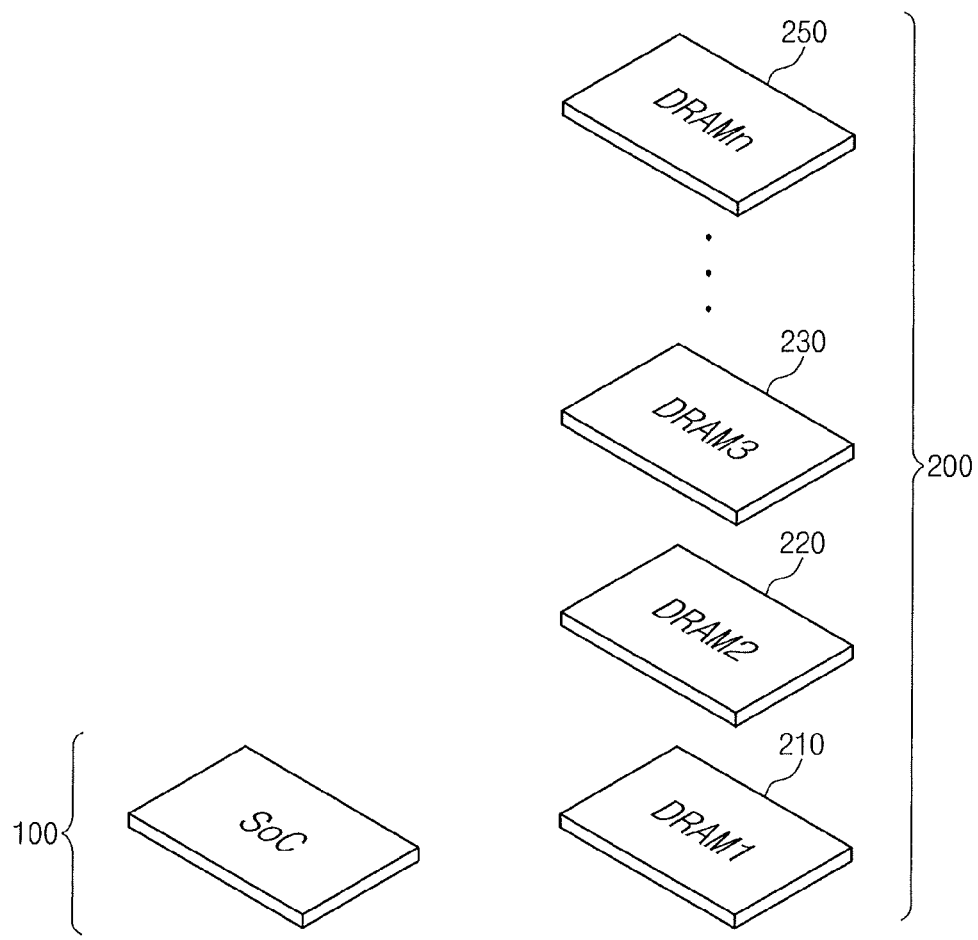
FIG. 5 is a schematic diagram illustrating a die arrangement structure of a memory system according to some example embodiments of the present inventive concepts.

FIG. 5 is a schematic diagram illustrating a die arrangement structure of a memory system according to some example embodiments of the present inventive concepts.

Referring to FIG. 5, an arrangement structure of a system on chip (SoC), which functions as a controller 100, and the semiconductor memory device 200 having a stacked chip structure is illustrated. The semiconductor memory device 200 may have a plurality of memory dies 210, 220, 230, and 250 operating based on a multi-rank structure. Because the semiconductor memory device 200 includes at least two memory dies, the semiconductor memory device 200 may have a dual-rank structure. However, the semiconductor memory device 200 may be implemented with a multi-rank structure including at least three memory dies.

In FIG. 5, the SoC 100 and the first memory die 210 may be disposed at the same layer and on a substrate. For example, when the SoC 100 is disposed at a first layer, the first memory die 210 may be also disposed at the first layer. Some example embodiments of the present inventive concepts are illustrated in FIG. 5 such that the second memory die 220 may be stacked on the first memory die 210. However, the scope and spirit of the present inventive concepts may not be limited thereto. For example, the first memory die 210 may be stacked on the second memory die 220.

Figure 6:
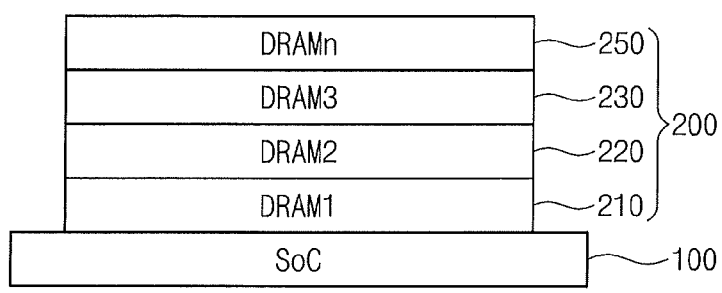
FIG. 6 is a cross-sectional view illustrating a die arrangement structure of a memory system according to some example embodiments of the present inventive concepts.

FIG. 6 is a cross-sectional view illustrating a die arrangement structure of a memory system according to some example embodiments of the present inventive concepts.

Referring to FIG. 6, a stacked type of arrangement structure of the SoC, which functions as a controller 100, and the semiconductor memory device 200 having a stacked chip structure is illustrated. The semiconductor memory device 200 may have the memory dies 210, 220, 230, and 250 operating based on a multi-rank structure. Some example embodiments of the present inventive concepts are illustrated in FIG. 6 such that the memory dies 210, 220, 230, and 250 are stacked on the SoC 100. However, the scope and spirit of the present inventive concepts may not be limited thereto. For example, the memory dies 210, 220, 230, and 250 may be, for example, implemented with a package on package (PoP) or may be implemented with a single package.

Moreover, when the SoC 100 is disposed at a first layer, the first memory die 210 may be disposed at the second layer. Some example embodiments of the present inventive concepts are illustrated in FIG. 6 such that the second memory die 220 is stacked on the first memory die 210. However, the scope and spirit of the present inventive concepts may not be limited thereto. For example, the first memory die 210 may be stacked on the second memory die 220, the n-th memory die 250 or the like.

It is noted that a high bandwidth memory (HBM) or a stacked chip structure to provide a high performance such as a high capacity and a high-speed operation may be provided.

The HBM may be a form of memory structure and may have a form, in which a plurality of memory dies are stacked on a buffer die (or base die) functioning as a logic circuit, disposed at a bottom layer. Here, each of the memory dies may be connected to the buffer die through a through silicon via (TSV) to exchange data and control signals with the buffer die.

A 2.5-dimension (2.5D) chip structure and a 3-dimension (3D) chip structure may be known as a stacked chip structure. The 2.5D chip structure may have a chip structure in which the HBM and a host are connected to each other using an interposer instead of a printed circuit board (PCB) to electrically connect with each other. The 3D chip structure may have a chip structure in which the HBM and the host are directly connected to each other by stacking the HBM on the host.

Figure 7:
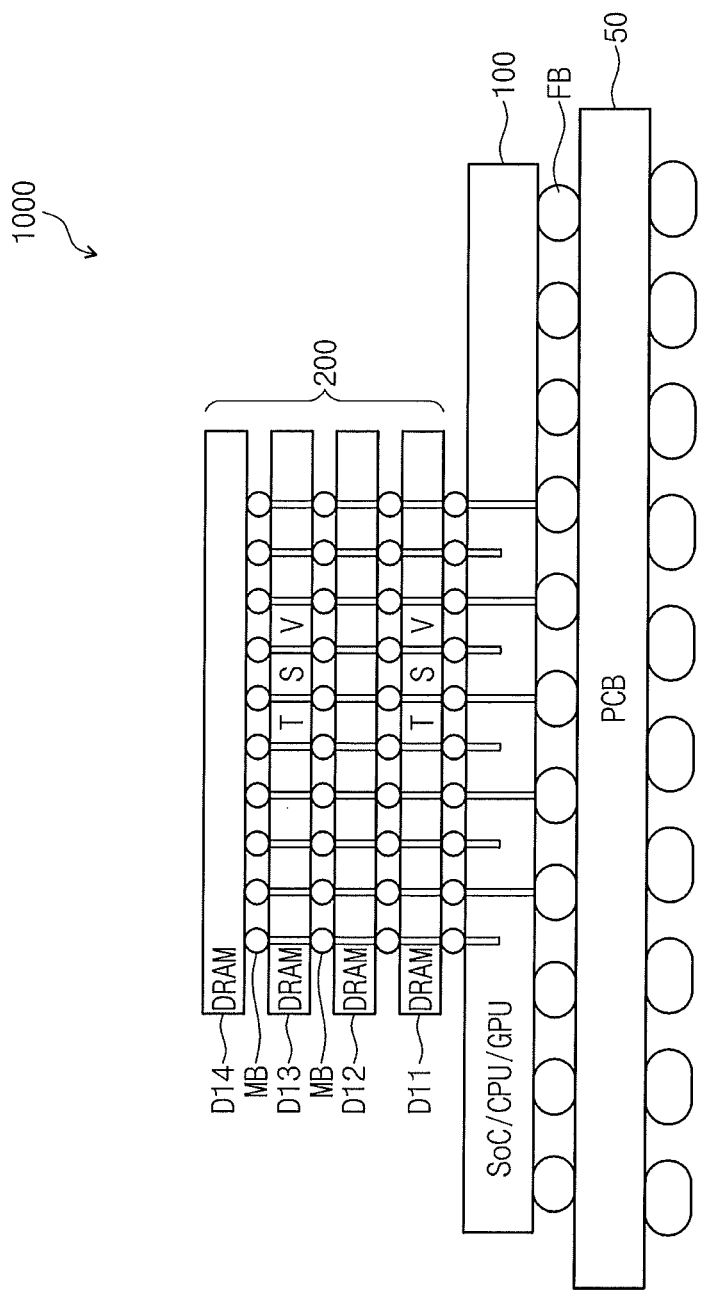
FIG. 7 is a cross-sectional view illustrating a 3D chip structure to which a die arrangement structure of FIG. 6 is applied according to some example embodiments of the present inventive concepts.

FIG. 7 is a cross-sectional view illustrating a 3D chip structure 1000 to which a die arrangement structure of FIG. 6 is applied according to some example embodiments of the present inventive concepts.

Referring to FIG. 7, a host die which function as a controller 100 may be a SoC, a central processing unit (CPU), a graphic processing unit (GPU), or the like. The host die 100 may be connected to a PCB 50 through a flip chip bump FB. The host die 100 may be disposed on a PCB 50. Memory dies D11 to D14 for forming a structure of the HBM 200 may be stacked on the host die 100. In FIG. 7, a buffer die or a logic die may be omitted. However, the buffer die or the logic die may be disposed between the memory die D11 and the host die 100. Micro-bumps MB may be disposed between the host die 100 and memory die D11 and between each of the memory die D11 to D14. To implement the structure of the HBM 200, TSV lines referred to as "through silicon via" may be formed in the memory dies D11 to D14. The TSV lines may be electrically connected to the micro-bumps MB formed between the memory dies D11 to D14. The TSV lines may extend in a substantially vertical direction of extension relative to a substantially horizontal direction of extension of the memory dies D11 to D14.

As a result, FIG. 7 illustrates the 3D chip structure 1000 in which the host die 100 is directly connected to the HBM 200 without interposing of an interposer layer. In a center pad type and a multi-rank structure, the 'other termination' or the 'all termination' according to some example embodiments of the present inventive concepts may be applied to the 3D chip structure 1000 illustrated in FIG. 7.

Figure 8:
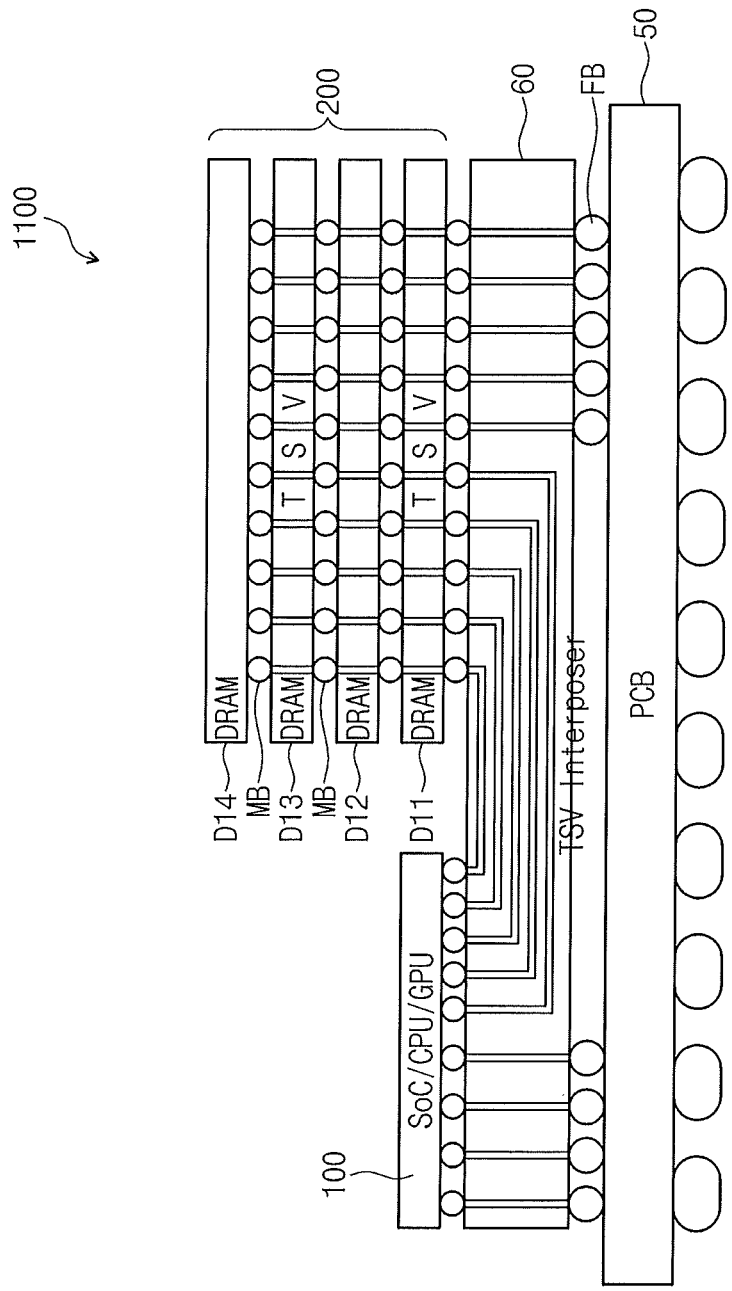
FIG. 8 is a cross-sectional view illustrating a 2.5D chip structure to which a die arrangement structure of FIG. 5 is applied according to some example embodiments of the present inventive concepts.

FIG. 8 is a cross-sectional view illustrating a 2.5D chip structure 1100 to which a die arrangement structure of FIG. 5 is applied according to some example embodiments of the present inventive concepts.

Referring to FIG. 8, the 2.5D chip structure 1100 may be a chip structure in which the HBM 200 and a host die which functions as a controller 100 are connected using an interposer layer 60.

The interposer layer 60 may be disposed on the PCB 50 and may be electrically connected to the PCB 50 through a flip chip bump FB.

The host die 100 and the memory dies D11 to D14 for forming a structure of the HBM 200 may be stacked on the interposer layer 60. In FIG. 8, a buffer die or a logic die may be omitted. However, the buffer die or the logic die may be disposed between the memory die D11 and the interposer layer 60. To implement the structure of the HBM 200, TSV lines may be formed in the memory dies D11 to D14. The TSV lines may extend in a substantially vertical direction of extension relative to a substantially horizontal direction of extension of the memory dies D11 to D14. The TSV lines may be electrically connected to micro-bumps MB formed between memory dies. Micro-bumps MB may be formed between the memory die D11 and the interposer 60 and between the hose die 100 and the interposer 60. TSV lines may also be formed in the interposer layer 60.

As a result, FIG. 8 illustrates the 2.5D chip structure 1100 in which an interposer layer 60 is interposed between the host die 100 and the memory die D11. In a center pad type and a multi-rank structure, the 'other termination' or the 'all termination' according to some example embodiments of the present inventive concepts may be applied to the 2.5D chip structure 1100 illustrated in FIG. 8.

Figure 9:
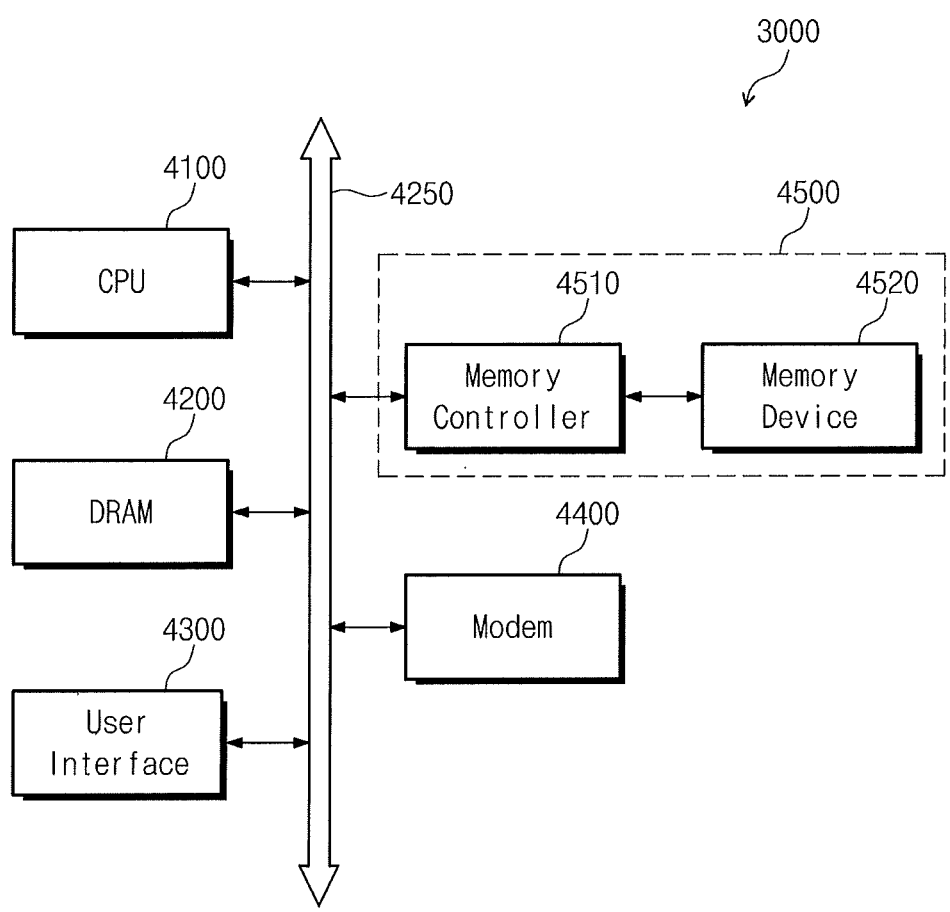
FIG. 9 is a block diagram illustrating an example embodiment of the present inventive concepts applied to a computing device.

FIG. 9 is a block diagram illustrating example embodiments of the present inventive concepts applied to a computing device 3000.

Referring to FIG. 9, the computing device 3000 may include a memory system 4500 having a memory device 4520 and a memory controller 4510. The computing device 3000 may include, for example, an information processing device, a computer, and the like. In some example embodiments, the computing device 3000 may include, for example, modulator/demodulator (MODEM) 4400, a central processing unit (CPU) 4100, a DRAM 4200, a user interface 4300 which are electrically connected to each other, in addition to the memory system 4500 by bus 4250. Data processed by the CPU 4100 or data inputted from an external device may be stored in the memory system 4500.

The computing device 3000 may be applied to, for example, a solid state drive (SSD), a camera image processor, other application chipsets or the like. In some example embodiments, the memory system 4500 may be implemented with an SSD. In such an embodiment, the computing device 3000 may store high-capacity data in the memory system 4500.

When the memory device 4520 is a DRAM, the memory controller 4510 in the memory system 4500 may transmit a command, an address, data, or other control signals to the memory device 4520 (that is, DRAM).

The memory 4520 may be implemented with a volatile memory or a nonvolatile memory. The volatile memory may be a DRAM, a static random access memory (SRAM), a thyristor RAM (TRAM), a zero capacitor RAM (Z-RAM), a twin transistor RAM (TTRAM), or the like.

The nonvolatile memory may be an electrically erasable programmable read-only memory (EEPROM), a flash memory, an magnetic RAM (MRAM), a spin-transfer torque MRAM, or the like. In a unit cell of the nonvolatile memory, one bit or bits of one or more may be stored.

The CPU 4100 may function as a host and may control an overall operation of the computing device 3000.

A host interface between the CPU 4100 and the memory controller 4510 may include various protocols for performing data exchange between the host and the memory controller 4500. In some example embodiments, the memory controller 4510 may be configured to communicate with the host or an external device through at least one of various interface protocols such as a universal serial bus (USB) protocol, a peripheral component interconnection (PCI), and the like.

The computing device 3000 illustrated in FIG. 9 may be one of various components of an electronic device, for example, a computer, a ultra-mobile personal computer (UMPC), a digital picture recorder, a digital video recorder, a digital video player, storage constituting a data center, a device capable of transmitting or receiving information in a wireless environment, one of various electronic devices constituting a home network, one of various electronic devices constituting a computer network, one of various electronic devices constituting a telematics network, a radio-frequency identification (RFID) device, one of various components constituting a computing system, or the like.

As described in FIG. 2, the memory device 4520 or the DRAM 4200 may have a center pad type. When the memory device 4520 or the DRAM 4200 operates based on a multi-rank structure, a termination may be made using the 'other termination' method or the 'all termination' method. Accordingly, even though a stub length is longer than a stub length according to an edge pad method, a stub effect according to the stub length may be minimized or reduced. In such an embodiment, the signal integrity may be improved.

The memory system 4500 of the computing device 3000 in FIG. 9 may be mounted using various kinds of packages such as a package on package (PoP), a ball grid arrays (BGAs), and the like.

Figure 10:
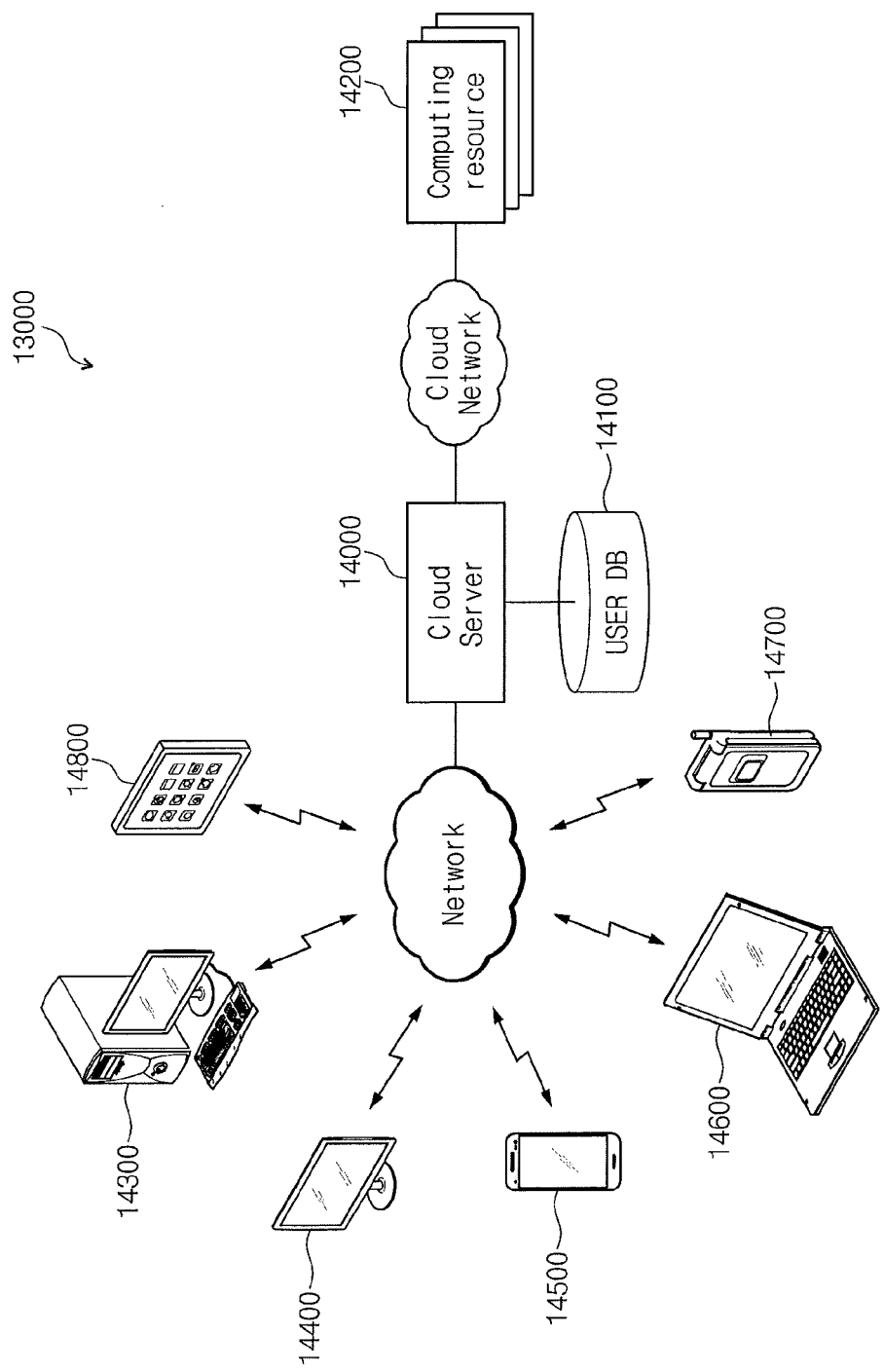
FIG. 10 is a schematic diagram illustrating an example embodiment of the present inventive concepts applied to a cloud system.

FIG. 10 is a diagram illustrating a cloud system 13000 according to some example embodiments of the present inventive concepts.

Referring to FIG. 10, a cloud system or cloud computing system 13000 may include, for example, a cloud server 14000, a user database (DB) 14100, a plurality of computing resources 14200, and a plurality of user terminals.

A user terminal may be, for example, an electronic device such as a computer, a smartphone, an e-book, a portable multimedia player (PMP), a portable game console, or the like.

The cloud system 13000 may provide an on-demand outsourcing service of the computing resources 14200 through an information network such as an internet based on a request of a user terminal. In a cloud computing environment, a service provider may integrate the computing resources 14200 of data centers, which are respectively placed at a physical locations different from each other, using a virtualization technology and may provide a service which users desire.

A service user may selectively use a service on a cyberspace created through the virtualization technology anytime and may selectively use as many services a user desires, without installing the computing resources 14200, for example, an application, storage, an operating system (OS), a security, and the like, at each user terminal and using the computing resources 14200.

A user terminal of a specific service user may access the cloud server 14000 through the information network including an internet and a mobile network. Each of the user terminals may receive a cloud computing service, particularly, video reproduction service, from the cloud server 14000. Some example embodiments of the present inventive concepts are illustrated in FIG. 10 such that the user terminal is a desktop PC 14300, a smart TV 14400, a smartphone 14500, a notebook PC 14600, a portable multimedia player (PMP) 14700, or a tablet PC 14800. However, the scope and spirit of the present inventive concepts may not be limited thereto. For example, the user terminal may be an electronic device to be accessible through an internet.

The cloud server 14000 may integrate the computing resources 14200 distributed in a cloud network and may provide the computing resources 14200 to the user terminal.

The computing resources 14200 may include, for example, several data services and may include data uploaded from the user terminal. The cloud server 14000 may integrate video database distributed in several locations using a virtualization technology and may provide a service which the user terminal requires.

A user may join the cloud computing service. At this time, user information may be stored in the user DB 14100. The user information may include, for example, log-in information and personal credit information, such as an address, a name, or the like. Moreover, the user information may include, for example, an index of a video. The index may include, for example, a list of videos completely reproduced, a list of videos being reproduced, and a stop time of videos being reproduced.

In some example embodiments, information of a video stored in the user DB 14100 may be shared between user devices. For example, when a reproduction is requested from the notebook PC 14600 and a video service is provided to the notebook PC 14600, a reproduction history of the video service may be stored in the user DB 14100. When a reproduction request of the same video service is received from the smartphone 14500, the cloud server 14000 may find and reproduce a video service with reference to the user DB 14100.

When the smartphone 14500 receives a video data stream through the cloud server 14000, an operation to decode the video data stream and to reproduce the decoded data stream may be similar to an operation of the smartphone 14500.

In some example embodiments, the cloud server 14000 may make reference to the reproduction history of the video service stored in the user DB 14100. For example, the cloud server 14000 may receive the reproduction request of a video stored in the user DB 14100 from the user terminal. When the video has a history in which the video was previously reproduced, the cloud server 14000 may reproduce the video from the beginning or from a previous stop point. That is, a streaming method may be changed according to a selection by a user through the user terminal.

The user terminal may include the semiconductor memory device, which is a mobile DRAM, described above. As described in FIG. 2, when the semiconductor memory device is a center pad type and operates based on a multi-rank structure, a termination may be made using the 'other termination' method or the 'all termination' method. Accordingly, even though a stub length is longer than a stub length according to an edge pad method, a stub effect according to the stub length may be minimized or reduced. In such an embodiment, the signal integrity may be improved. Accordingly, an operating performance or reliability of the cloud system 13000 may increase.

According to some example embodiments of the present inventive concepts, the signal integrity issue which is presented when a stub length of a redistribution layer exceeds a stub effect permitted length may be minimized or resolved.

The foregoing is illustrative of the present inventive concepts and is not to be construed as limiting thereof. Although a few example embodiments have been described, those skilled in the art will readily appreciate that many modifications are possible in the example embodiments without materially departing from the novel teachings and advantages of the present inventive concepts. Accordingly, all such modifications are intended to be included within the scope of the present inventive concepts as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A method of operating a semiconductor memory device including a first memory die having a first termination resistor configured for an on-die termination, and a second memory die having a second termination resistor configured for the on-die termination and formed on the first memory die, each of the first and second memory dies operating based on a multi-rank structure, the method comprising:
connecting the second termination resistor to the second memory die when the first memory die is accessed; and
connecting the first termination resistor to the first memory die when the second memory die is accessed.

2. The method of claim 1, wherein a center pad of each of the first and second memory dies is wire-bonded at a die edge through a redistribution layer.

3. The method of claim 2, wherein a stub length of the redistribution layer is greater than or equal to 1000 µm.

4. The method of claim 1, wherein the first termination resistor is further connected to the first memory die when the first memory die is accessed.

5. The method of claim 1, wherein the second termination resistor is further connected to the second memory die when the second memory die is accessed.

6. The method of claim 1, wherein each of the first and second memory dies is a mobile dynamic random access memory (DRAM).

7. The method of claim 1, wherein a connection operation of the first termination resistor is performed in response to a first on-die control signal provided from a controller.

8. The method of claim 1, wherein a connection operation of the second termination resistor is performed in response to a second on-die control signal provided from a controller.

9. The method of claim 8, wherein the first memory die is stacked on the controller and is controlled by the controller.

10. The method of claim 8, wherein the first memory die is disposed at a same layer as the controller.

11. The method of claim 1, wherein each of the first and second memory dies has a center pad type.

12. A method of operating a semiconductor memory device including a first memory die having a first termination resistor configured for an on-die termination, and a second memory die having a second termination resistor configured for the on-die termination and formed on the first memory die, each of the first and second memory dies operating based on a multi-rank structure, the method comprising:
connecting the first termination resistor and the second termination resistor to the first memory die and the second memory die, respectively when the first memory die is accessed; and
connecting the second termination resistor and the first termination resistor to the second memory die and the first memory die, respectively when the second memory die is accessed.

13. The method of claim 12, wherein a center pad of each of the first and second memory dies is commonly wire-bonded at a die edge through a redistribution layer.

14. The method of claim 13, wherein a stub length of the redistribution layer is greater than or equal to 800 µm.

15. The method of claim 12, wherein the second termination resistor is further connected to the second memory die when the second memory die is accessed.

16. The method of claim 12, wherein the first memory die is disposed at a same layer as a controller in a same package and receives an address and a command from the controller.

17. The method of claim 12, wherein each of the first and second memory dies has a center pad type.

18. A semiconductor memory device comprising:
a first memory die including a first termination resistor for an on-die termination; and
a second memory die disposed on the first memory die and including a second termination resistor for the on-die termination,
wherein each of the first and second memory dies includes a pad that is a center pad type, and is configured to operate based on a multi-rank structure,
the second termination resistor is configured to be connected to the second memory die based on an access operation of the first memory die, and
the first termination resistor is configured to be connected to the first memory die based on an access operation of the second memory die.

19. The semiconductor memory device of claim 18, wherein an on-die termination of the first memory die is made based on the access operation of the second memory die, and
an on-die termination of the second memory die is made based on the access operation of the first memory die.

20. The semiconductor memory device of claim 18, wherein the second termination resistor is selected during an operation of the first memory die, and
the first termination resistor is selected during an operation of the second memory die.

* * * * *